(12) United States Patent
Han

(10) Patent No.: US 7,558,131 B2
(45) Date of Patent: Jul. 7, 2009

(54) NAND SYSTEM WITH A DATA WRITE FREQUENCY GREATER THAN A COMMAND-AND-ADDRESS-LOAD FREQUENCY

(75) Inventor: Jin-Man Han, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 11/436,352

(22) Filed: May 18, 2006

(65) Prior Publication Data

US 2007/0268775 A1    Nov. 22, 2007

(51) Int. Cl.
*G11C 7/00* (2006.01)
(52) U.S. Cl. ............... 365/192; 365/230.01; 365/233.1; 365/189.04; 365/233.12
(58) Field of Classification Search ............ 365/185.17, 365/192, 230.01, 233.1, 189.04, 233.12
See application file for complete search history.

(56) References Cited

U.S. PATENT DOCUMENTS

| 6,247,104 | B1* | 6/2001 | Suzuki ........................ 711/167 |
| 6,307,806 | B1* | 10/2001 | Tomita et al. ................ 365/233 |
| 7,218,137 | B2* | 5/2007 | Vadi et al. ....................... 326/38 |
| 7,345,926 | B2* | 3/2008 | Kagan et al. ........... 365/185.33 |
| 2003/0031065 | A1 | 2/2003 | Maruyama |
| 2003/0093702 | A1* | 5/2003 | Luo et al. .................... 713/320 |
| 2003/0234408 | A1 | 12/2003 | Tanaka |
| 2004/0105292 | A1* | 6/2004 | Matsui ........................ 365/63 |
| 2004/0172576 | A1 | 9/2004 | Yoshii et al. |
| 2005/0213396 | A1* | 9/2005 | Aoki ...................... 365/189.05 |
| 2005/0242835 | A1* | 11/2005 | Vadi et al. ....................... 326/37 |
| 2006/0233036 | A1* | 10/2006 | Blodgett et al. ........ 365/230.01 |
| 2007/0086228 | A1* | 4/2007 | Choi ............................ 365/63 |

FOREIGN PATENT DOCUMENTS

| EP | 1 315 171 A2 | 5/2003 |
| EP | 1 469 480 A2 | 10/2004 |
| WO | WO 2005/031754 A1 | 4/2005 |

* cited by examiner

*Primary Examiner*—Thong Q Le
(74) *Attorney, Agent, or Firm*—Leffert Jay & Polglaze, P.A.

(57) ABSTRACT

The invention provides methods and apparatus. A NAND flash memory device receives command and address signals at a first frequency and a data signal at a second frequency that is greater than the first frequency.

46 Claims, 2 Drawing Sheets

NAND SYSTEM WITH A DATA WRITE FREQUENCY GREATER THAN A COMMAND-AND-ADDRESS-LOAD FREQUENCY

TECHNICAL FIELD OF THE INVENTION

The present invention relates generally to NAND memory systems and in particular the present invention relates to a NAND system with a data write frequency greater than a command-and-address-load frequency.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, cellular telephones and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bit line.

The memory array is accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the column bit line to the source line through each NAND string via the corresponding select gates, restricted only by the selected memory cells of each string. This places the current-encoded data values of the row of selected memory cells on the column bit lines.

A NAND flash memory device receives a command, addresses, and data sequentially over a common multiplexed input/output bus and outputs data over the common multiplexed input/output bus. The memory device also receives a single clock signal for timing or synchronizing the command and the address input and the data input. The command, portions of a column address, portions of a row address, and portions of the input data are received at a frequency of the single clock signal. The frequency of the clock signal has been chosen based on a maximum time required by the memory device to receive any one of the command, address, or data components.

For the reasons stated above, and for other reasons stated below which will become apparent to those skilled in the art upon reading and understanding the present specification, there is a need in the art for alternative timing schemes in memory devices.

SUMMARY

The above-mentioned problems with timing schemes in memory devices and other problems are addressed by the present invention and will be understood by reading and studying the following specification.

For one embodiment, the invention provides a method of operating a NAND flash memory device that includes receiving command and address signals at a first frequency, and receiving a data signal at a second frequency that is greater than the first frequency.

Further embodiments of the invention include methods and apparatus of varying scope.

DETAILED DESCRIPTION

Figure 1:
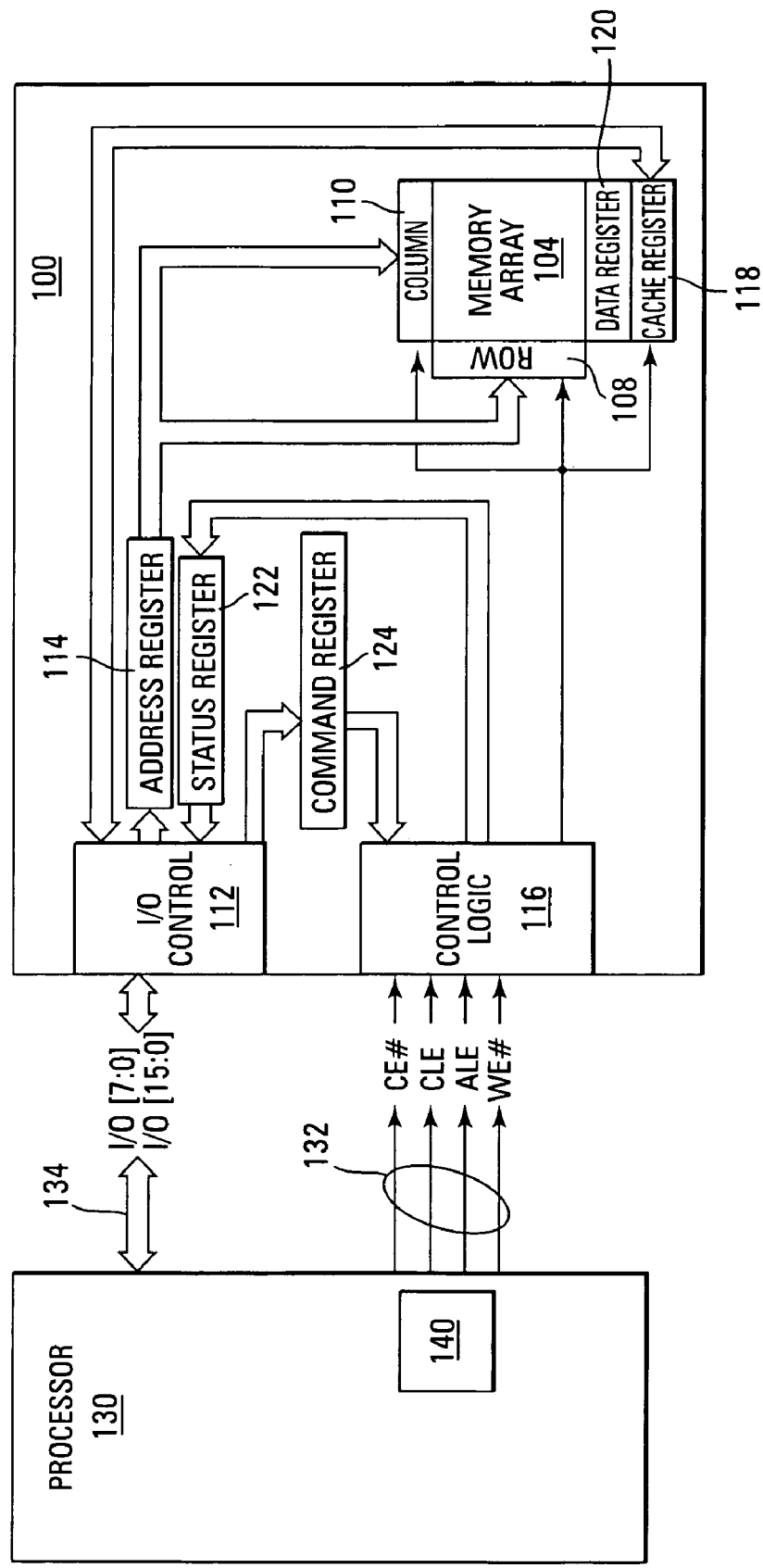
FIG. 1 is a simplified block diagram of a NAND flash memory device, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a simplified block diagram of a NAND flash memory device 100 coupled to a processor 130 as part of an electronic system, according to an embodiment of the invention. The processor 130 may be a memory controller or other external host device. Memory device 100 includes an array of memory cells 104 arranged in rows and columns. A row decoder 108 and a column decoder 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decoder 108 and column decoder 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decoder 108 and column decoder 110 to control the row decoder 108 and column decoder 110 in response to the addresses. Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is pass from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE# in accordance with the present invention. Memory device 100 receives command signals (or commands), address signals (or addresses), and data signals (or data) from processor 130 over a multiplexed input/output (I/O) bus 134 and outputs data to processor 130 over I/O bus 134.

Specifically, the commands are received over input/output (I/O) pins [0:7] of I/O bus 134 at I/O control circuitry 112 and are written into command register 124. The addresses are received over input/output (I/O) pins [0:7] of bus 134 at I/O control circuitry 112 and are written into address register 114. The data are received over input/output (I/O) pins [0:7] for an 8-bit device or input/output (I/O) pins [0:15] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [0:7] for an 8-bit device or input/output (I/O) pins [0:15] for a 16-bit device. It will be appreciated by those skilled in the art that additional circuitry and control signals can be provided, and that the memory device of FIG. 1 has been simplified to help focus on the invention. Additionally, while specific I/O pins are described in accordance with popular conventions for receipt and output of the various signals, it is noted that other combinations or numbers of I/O pins may be used in the various embodiments.

Figure 2:
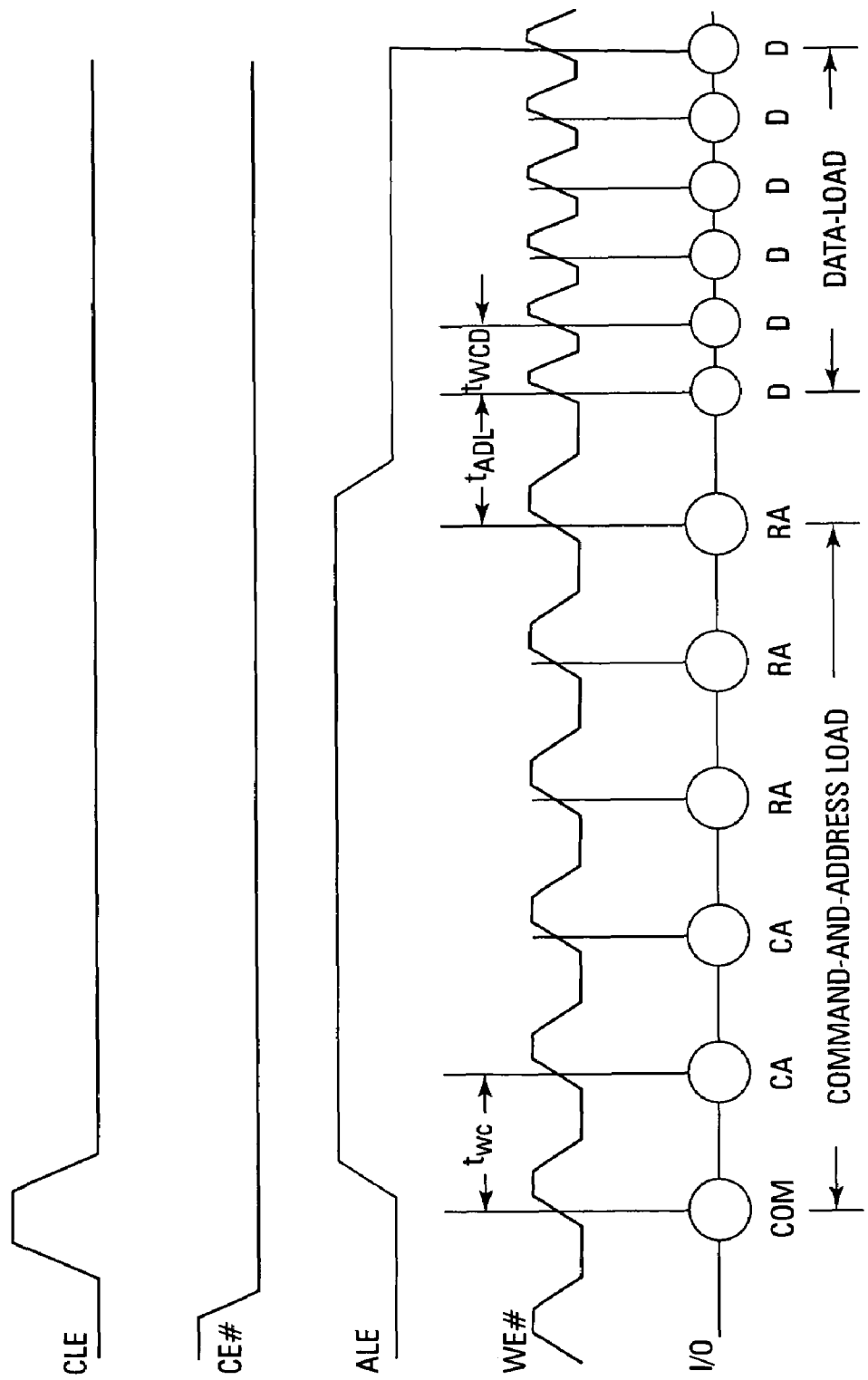
FIG. 2 is a timing diagram for a command-and-address load and a data load, according to another embodiment of the invention.

FIG. 2 is a timing diagram for a command-and-address load and a data load (or write), according to another embodiment of the invention. Note that the write enable WE# control signal functions as a clock signal for timing the sequential receipt, over I/O bus 134, at memory device 100 of a command COM, portions of a first address, such as portions CA of a starting column address, portions of a second address, such as portions RA of a starting row address, and data portions D. For one embodiment, processor 130 includes a clock-and-control circuit 140 (FIG. 1) for generating and controlling the write enable WE#. That is, clock-and-control circuit 140 modifies the write enable WE# according to whether a command, an address, or data is being sent from processor 130 to memory device 100. For example, clock-and-control circuit 140 increases the frequency of write enable WE# in response to processor 130 sending data to memory device 100, so that the data is loaded at a higher frequency than the command or address.

The command COM is loaded into command register 124, the starting column and row addresses into address register 114, and the data into cache register 118 or directly into data register 120. Note that the portions CA of a starting column address constitute the starting column address, and portions RA of the starting row address constitute the starting row address. A first portion RA of the starting row address is loaded once the starting column address has been completely loaded. The column and row addresses are respectively latched to column decoder 110 and row decoder 108 (FIG. 1) for decoding.

The command COM and the portions CA of the starting column addresses, and the portions RA of the starting row address are loaded in succession and are respectively loaded during a command-and-address cycle time $t_{WC}$ of a command-and-address load portion of the write enable WE#. For one embodiment, the command-and-address cycle time $t_{WC}$ starts at a rising clock edge of the command-and-address load portion of the write enable WE# and ends at a successively immediately following rising clock edge of the command-and-address load portion of the write enable WE#, as shown in FIG. 2.

Specifically, the command COM is loaded into command register 124 (FIG. 1) on a rising clock edge of the command-and-address load portion of the write enable WE# when the chip enable CE# and the address latch enable ALE are low and the command latch enable CLE is high, as shown in FIG. 2. The portions CA of the column address and the portions RA the row address are loaded into address register 114 (FIG. 1) on a rising clock edge of the command-and-address load portion of the write enable WE# when the chip enable CE# and the command latch enable CLE are low and the address latch enable ALE is high, as shown in FIG. 2.

A first portion CA of the column address is loaded at the rising clock edge of the command-and-address load portion of the write enable WE# immediately following the rising clock edge of the command-and-address load portion of the write enable WE# at which the command COM was loaded. A first portion RA of the row address is loaded at the rising clock edge of the command-and-address load portion of the write enable WE# immediately following the rising clock edge of the command-and-address load portion of the write enable WE# at which the last portion CA of the column address was loaded.

The data are loaded during a data-load cycle time $t_{WCD}$ of a data-load portion of the write enable WE#. For one embodiment, the data-load cycle time $t_{WCD}$ of the data-load portion of the write enable WE# starts at a rising clock edge of the data-load portion of the write enable WE# and ends at an immediately following rising clock edge of the data-load portion of the write enable WE#, as shown in FIG. 2. For another embodiment, the data-load portion of the write enable WE#, and thus data loading, starts after a delay time $t_{ADL}$ that starts at the last rising clock edge of the command-and-address load portion of the write enable WE#, i.e., corresponding to the loading of the last portion RA of the row address. For another embodiment, the address latch enable ALE transitions low during delay time $t_{ADL}$, while the chip enable CE# and the command latch enable CLE remain low. Therefore, data are loaded at immediately successive rising clock edges of the data-load portion of the write enable WE# when the address latch enable ALE, the chip enable CE#, and the command latch enable CLE are low.

Note that data-load cycle time $t_{WCD}$ of a data-load portion of the write enable WE# is shorter than the command-and-address cycle time $t_{WC}$ of the command-and-address load portion of the write enable WE#. Therefore, the frequency of the data-load portion of the write enable WE# is greater than the command-and-address load portion of the write enable WE#. For one embodiment, the frequency of the data-load portion may be about a factor of two greater than the frequency of the command-and-address load portion dependent upon the capability of the memory device. This allows for faster data loading and releases the write enable WE# sooner for other operations. For one embodiment, processor may use a clock divider that divides the period of the command-and-address load portion of the write enable WE# to obtain the data-load portion of the write enable WE#.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a NAND flash memory device, comprising:
   receiving command and address signals at a first frequency in response to a clock signal having a first frequency;
   increasing the frequency of the clock signal from the first frequency to a second frequency; and
   receiving a data signal at the second frequency in response to the clock signal;
   wherein the command, address, and data signals are received over a common bus.

2. The method of claim 1 further comprises receiving the command, address, and data signals in succession.

3. The method of claim 1, wherein the second frequency commences after a delay time between receiving a last portion of the address signal and receiving a first portion of the data signal.

4. The method of claim 1, wherein the second frequency commences at a rising clock edge of the clock signal that occurs immediately after a rising clock edge of the clock signal at which a last portion of the address signal was received.

5. The method of claim 1, wherein:
   the command signal and the address signal are respectively received at immediately successive rising clock edges of a first portion of the clock signal;
   a first portion of the data signal is received at a rising clock edge of a second portion of the clock signal, the rising clock edge of the second portion of the clock signal at which the first portion of the data signal is received is located immediately after a rising clock edge of the first portion of the clock signal at which a last portion of the address signal is received; and
   remaining portions of the data signal are received at immediately successive rising clock edges of the second portion of the clock signal;
   wherein the first portion of the clock signal has the first frequency and the second portion of the clock signal has the second frequency.

6. The method of claim 1, wherein the address signal is a starting address signal.

7. The method of claim 1, wherein the address signal is received at a rising edge of the clock signal immediately following a rising edge of the clock signal at which the command signal was received.

8. The method of claim 1, wherein the address signal comprises first and second addresses.

9. The method of claim 8, wherein a first portion of the second address is received at a rising edge of the clock signal immediately following a rising edge of the clock signal at which a last portion of the first address was received.

10. The method of claim 1, wherein receiving the command and address signals comprises receiving the command signal at a command register of the memory device and receiving the address signal at an address register of the memory device.

11. The method of claim 1, wherein receiving data signal comprises receiving the data signal at a cache register or a data register of the memory device.

12. The method of claim 1 further comprises decoding the address signal.

13. The method of claim 1, wherein the address signal comprises column and row addresses.

14. A method of operating a NAND flash memory device, comprising:
   respectively successively receiving a command, portions of a first address, portions of a second address, and data over a common bus;
   wherein the command, the portions of the first address, and the portions of the second address are received at a first frequency in response to a clock signal having the first frequency;
   wherein the frequency of the clock signal is increased from the first frequency to a second frequency after receiving the portions of the second address; and
   wherein the data are received at the second frequency in response to the clock signal.

15. The method of claim 14, wherein the second frequency commences after a delay time between receiving a last portion of the second address and receiving a first portion of the data.

16. The method of claim 14, wherein the second frequency commences at a rising clock edge of the clock signal that occurs immediately after a rising clock edge of the clock signal at which a last portion of the second address was received.

17. The method of claim 14, wherein the command, the portions of the first address, and the portions of the second address are respectively received at immediately successive rising clock edges of a portion of the clock signal having the first frequency.

18. The method of claim 14, wherein respective portions of the data are received at immediately successive rising clock edges of a portion of the clock signal having the second frequency.

19. The method of claim 14, wherein a first portion of the first address is received at a rising edge of the clock signal immediately following a rising edge of the clock signal at which the command was received.

20. The method of claim 14, wherein a first portion of the second address is received at a rising edge of the clock signal immediately following a rising edge of the clock signal at which a last portion of the first address was received.

21. The method of claim 14, wherein the first and second addresses are respectively column and row addresses.

22. A method of operating a NAND flash memory device, comprising:

respectively receiving a command, portions of a starting first address, and portions of a starting second address over a common bus at immediately successive rising edges of a first portion of a clock signal having a first frequency; and respectively receiving portions of data over the common bus at immediately successive rising edges of a second portion of the clock signal having a second frequency that is greater than the first frequency;

wherein a rising clock edge of the second portion of the clock signal at which a first portion of the data is received immediately successively follows a rising clock edge of the first portion of the clock signal at which a last portion of the second data is received.

23. The method of claim 22, wherein a delay time occurs between the rising clock edge of the second portion of the clock signal at which the first portion of the data is received and the rising clock edge of the first portion of the clock signal at which the last portion of the second address is received.

24. The method of claim 22, wherein receiving a command, portions of a starting first address, and portions of a starting second address comprises receiving the command at a command register of the memory device and receiving the portions of the starting first address, and the portions of the starting second address at an address register of the memory device.

25. The method of claim 24 further comprises respectively decoding the first and second addresses at first and second decoders of the memory device.

26. The method of claim 22, wherein receiving portions of data comprises receiving the portions of the data at a cache register or a data register of the memory device.

27. A method of operating a NAND flash memory device, comprising:

respectively receiving a command, portions of a starting column address, and portions of a starting row address over a common bus at immediately successive rising edges of a first portion of a clock signal having a first frequency; and respectively receiving portions of data over the common bus at immediately successive rising edges of a second portion of the clock signal having a second frequency that is greater than the first frequency;

wherein a rising clock edge of the second portion of the clock signal at which a first portion of the data is received immediately successively follows a rising clock edge of the first portion of the clock signal at which a last portion of the row data is received.

28. An electronic system, comprising:

a processor;

a NAND flash memory device; and an input/output bus coupled between the processor and the memory device;

wherein the processor is adapted to perform a method, comprising:

generating a clock signal having a first frequency for timing command and address signals into the memory device;

transmitting the command and the address signals at the first frequency to the memory device over the input/output bus;

increasing the frequency of the clock signal to a second frequency for timing a data signal into the memory device; and transmitting the data signal at the second frequency to the memory device over the input/output bus.

29. The electronic system of claim 28, wherein the method further comprises transmitting the command, address, and data signals in succession.

30. The electronic system of claim 28, wherein, in the method, the second frequency commences after a delay time between transmitting a last portion of the address signal and transmitting a first portion of the data signal.

31. The electronic system of claim 28, wherein, in the method, the second frequency commences at a rising clock edge of the clock signal that occurs immediately after a rising clock edge of the clock signal at which a last portion of the address signal was transmitted.

32. The electronic system of claim 28, wherein, in the method, the address signal is received at a rising edge of the clock signal immediately following a rising edge of the clock signal at which the command signal was received.

33. The method of claim 28, wherein, in the method, the address signal comprises first and second addresses.

34. The electronic system of claim 33, wherein, in the method, a first portion of the second address is received at a rising edge of the clock signal immediately following a rising edge of the clock signal at which a last portion of the second address was received.

35. The electronic system of claim 28, wherein, in the method, the command and the address signals are respectively transmitted at immediately successive rising clock edges of a first portion of the clock signal;

a first portion of the data signal is transmitted at a rising clock edge of a second portion of the clock signal, the rising clock edge of the second portion of the clock signal at which the first portion of the data signal is transmitted is located immediately after a rising clock edge of the first portion of the clock signal at which a last portion of the address signal is transmitted; and remaining portions of the data signal transmitted at immediately successive rising clock edges of the second portion of the clock signal;

wherein the first portion of the clock signal has the first frequency and the second portion of the clock signal has the second frequency.

36. The electronic system of claim 28, wherein, in the method, the address signal is a starting address signal.

37. The electronic system of claim 28, wherein, in the method, the address signal comprises column and row addresses.

38. An electronic system, comprising:

a processor;

a NAND flash memory device;

an input/output bus coupled between the processor and the memory device; and a control link coupled between the processor and the memory device;

wherein the processor is adapted to perform a method, comprising:

respectively transmitting a command, portions of a starting first address, and portions of a starting second address to the memory device over the input/output bus at immediately successive rising edges of a first portion of a clock signal having a first frequency, the clock signal generated within the processor and transmitted to the memory device over the control link; and respectively transmitting portions of data to the memory device over the input/output bus at immediately successive rising edges of a second portion of the clock signal having a second frequency that is greater than the first frequency;

wherein a rising clock edge of the second portion of the clock signal at which a first portion of the data is transmitted immediately successively follows a rising clock edge of the first portion of the clock signal at which a last portion of the second address is transmitted.

39. The electronic system of claim 38, wherein, in the method, a delay time occurs between the rising clock edge of the second portion of the clock signal at which the first portion of the data is transmitted and the first portion of the clock signal at which the last portion of the second address is transmitted.

40. An electronic system, comprising:
a processor;
a NAND flash memory device;
an input/output bus coupled between the processor and the memory device; and
a control link coupled between the processor and the memory device;
wherein the processor is adapted to perform a method, comprising:
respectively transmitting a command, portions of a starting column address, and portions of a starting row address to the memory device over the input/output bus at immediately successive rising edges of a first portion of a clock signal having a first frequency, the clock signal generated within the processor and transmitted to the memory device over the control link; and
respectively transmitting portions of data to the memory device over the input/output bus at immediately successive rising edges of a second portion of the clock signal having a second frequency that is greater than the first frequency;
wherein a rising clock edge of the second portion of the clock signal at which a first portion of the data is transmitted immediately successively follows a rising clock edge of the first portion of the clock signal at which a last portion of the row address is transmitted.

41. An electronic system, comprising:
a processor;
a NAND flash memory device; and
an input/output bus coupled between the processor and the memory device;
wherein the processor comprises control-and-clock circuitry for generating varying clock signals for timing transmission of control, address, and data signals from the processor to the memory device over the input/output bus;
wherein transmission of the control and address signals is timed by a first portion of the clock signal having a first frequency; and
wherein transmission of the data signal is timed by a second portion of the clock signal having a second frequency greater than the first frequency.

42. The electronic system of claim 41, wherein the command, address, and data signals are transmitted in succession.

43. The electronic system of claim 41, wherein the second frequency commences after a delay time between transmitting a last portion of the address signal and transmitting a first portion of the data signal.

44. An electronic system, comprising:
a processor comprising control-and-clock circuitry;
a NAND flash memory device; and
an input/output bus coupled between the processor and the memory device;
wherein the control-and-clock circuitry generates a first clock signal having a first frequency in response to the processor transmitting control and address signals to the memory device over the input/output bus for timing the control and address signals; and
wherein the control-and-clock circuitry generates a second clock signal having a second frequency, greater than the first frequency, in response to the processor transmitting a data signal to the memory device over the input/output bus for timing the data signal.

45. The electronic system of claim 44, wherein the command, address, and data signals are transmitted in succession.

46. The electronic system of claim 44, wherein the control-and-clock circuitry generates the second frequency after a delay time between transmitting a last portion of the address signal and transmitting a first portion of the data signal.

* * * * *

UNITED STATES PATENT AND TRADEMARK OFFICE
CERTIFICATE OF CORRECTION

PATENT NO. : 7,558,131 B2
APPLICATION NO. : 11/436352
DATED : July 7, 2009
INVENTOR(S) : Jin-Man Han Page 1 of 1

It is certified that error appears in the above-identified patent and that said Letters Patent is hereby corrected as shown below:

In column 5, line 33, in Claim 1, delete "a" and insert -- the --, therefor.

Signed and Sealed this

First Day of September, 2009

David J. Kappos
*Director of the United States Patent and Trademark Office*